United States Patent [19]
Mundinger et al.

[11] Patent Number: 5,105,430
[45] Date of Patent: Apr. 14, 1992

[54] THIN PLANAR PACKAGE FOR COOLING AN ARRAY OF EDGE-EMITTING LASER DIODES

[75] Inventors: David C. Mundinger, Stockton; William J. Benett, Livermore, both of Calif.

[73] Assignee: The United States of America as represented by the United States Department of Energy, Washington, D.C.

[21] Appl. No.: 682,770

[22] Filed: Apr. 9, 1991

[51] Int. Cl.⁵ .................................... H01S 3/04
[52] U.S. Cl. ............................ 372/35; 372/50
[58] Field of Search ........................ 372/35, 50

[56]   References Cited
U.S. PATENT DOCUMENTS 4,791,634  12/1988  Miyake ........................ 372/35
4,984,246   1/1991  Cabaret et al. ................ 372/35

Primary Examiner—Leon Scott, Jr.
Attorney, Agent, or Firm—Henry P. Sartorio; L. E. Carnahan; William R. Moser

[57]   ABSTRACT

A laser diode array is disclosed that includes a plurality of planar assemblies and active cooling of each assembly. The laser diode array may be operated in a long duty cycle, or in continuous operation. A laser diode bar and a microchannel heat sink are thermally coupled in a compact, thin planar assembly having the laser diode bar located proximate to one edge. In an array, a number of such thin planar assemblies are secured together in a stacked configuration, in close proximity so that the laser diodes are spaced closely. The cooling means includes a microchannel heat sink proximate to the laser diode bar to absorb heat generated by laser operation. To provide the coolant to the microchannels, each thin planar assembly comprises passageways that connect the microchannels to inlet and outlet corridors. Each inlet passageway may comprise a narrow slot that directs coolant into the microchannels and increases the velocity of flow therethrough. The corridors comprises holes extending through each of the assemblies in the array. The inlet and outlet corridors are connected to a conventional coolant circulation system. The laser diode array with active cooling has applications as an optical pump for high power solid state lasers, or by mating the diodes with fiber optic lenses. Further, the arrays can be useful in applications having space constraints and energy limitations, and in military and space applications. The arrays can be incorporated in equipment such as communications devices and active sensors.

24 Claims, 6 Drawing Sheets

THIN PLANAR PACKAGE FOR COOLING AN ARRAY OF EDGE-EMITTING LASER DIODES

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to laser diodes and arrays of laser diodes, and further relates to an apparatus for cooling laser diodes during operation. More specifically, the present invention relates to a laser diode array that is actively cooled and provides a laser output having a high average intensity. In its subject matter, the present invention is related to patent application Ser. No. 549,509, entitled "Modular Package for Cooling a Laser Diode Array," filed in the U.S. Patent Office on July 6, 1990.

2. Description of Related Art

Laser diodes have many advantages over conventional lasers. Laser diodes are small and compact, they are efficient at converting electrical energy into laser energy, and they are reliable. However, when a laser diode is operated at a high average power, it generates a substantial amount of heat in a small volume, thereby raising the temperature of the diode which has negative effects such as a wavelength shift and a loss of efficiency. If the temperature gets high enough, destruction of the diode package may result. Therefore, present uses of laser diodes are generally limited to applications requiring low average power.

Laser diodes have some similarities to Light Emitting Diodes (LEDs). A typical laser diode is comprised of a semiconductor material, such as Gallium Arsenide (GaAs), that is manufactured to have a pn junction. Like laser diodes, LEDs have a pn junction formed in the semiconductor material. Briefly, the electroluminescence at a pn junction is the result of electrical current applied across the pn junction, and is associated with the band properties of semiconductor material. As a result of these band properties, an electron may combine with a hole (a lack of an electron) in a recombination that produces radiation. In a typical LED, the effect of an increase in current is to increase the radiative recombination rate well above that of the non-radiative recombination rate. Laser diodes have an additional feature over the LED-facets (reflective surfaces) on each end of pn junction. These facets define a laser cavity, which causes laser oscillation to occur along the length of the pn junction.

Laser radiation has application in a wide variety of disciplines, such as communications, medicine, the military, research, and any other field where directed electromagnetic radiation is an advantage.

When compared with other lasers, the laser diode is distinguishable by several features. One distinguishing feature is the size of the laser diode. Laser diodes can be manufactured in a package much smaller than other laser devices such as gas lasers that require large gas tubes and specialized optics equipment such as Brewster windows, mirrors, spatial filters, and lenses. Another distinguishing feature of the laser diode is its efficiency at converting the input electrical power to output laser intensity. Laser diodes can readily achieve efficiencies of 50% or more in converting electrical energy to laser energy, while other lasers have efficiencies from 10% to less than 1%. For example, the highest efficiency achieved by other lasers is attained by the $CO_2$ laser, which may attain an efficiency of 10%. Despite their high efficiency, laser diodes have not been applied in high power applications due primarily to the problem of heat dissipation. Other high power lasers, such as the copper vapor lasers, have an efficiency of 1% or less. Additional distinguishing features of the laser diode include a fast response to control signals, and simplicity of design. Manufacturing of laser diodes is known in the art, and a capability exists to manufacture many types of laser diodes.

One type of laser diode is the edge emitting laser diode, often termed "laser diode bars". These diodes emit laser light along a length of their edge. For example, an edge emitting laser diode can output a beam that has an emitting edge length of one centimeter, and a width of 0.3 mm. Typically, an edge emitting laser diode will be manufactured of a single block of GaAs, with a pn junction formed in a plane throughout the block, and the facets positioned on opposing edges of the plane defined by the pn junction. Conductors are constructed on each side of the pn junction so that when current is applied, current passes through the pn junction. The current creates a population inversion across the pn junction, and lasing action can occur.

For any laser diode, heat production is directly associated with the output intensity. Further, a high output intensity results from a large current applied to the diode. The basic mechanisms leading to heat production in a diode are the series resistances of the diode and non-radiative recombination. The series resistances include the resistance of the semiconductor material, and the resistance of the contacts, which produce heat during current flow. The resistances produce heat as current is applied, in an amount of heat flux proportional to $I^2R$.

Due to this heat production, a basic limitation on the output intensity of a diode is temperature buildup from heat produced in the pumping process. For maximum efficiency, a diode must have a temperature that is below 25° C. For reliable, long lived operation of the diode, temperatures may be less than 50° C. without substantial loss of efficiency. Temperatures even moderately above 50° C. will substantially affect efficiency and reliability, substantially shortening the useful life of the diode. Furthermore, at higher temperatures the output light will be shifted in wavelength. High temperatures encourage the growth of defects in the laser diode, which decrease efficiency. A larger current may be applied to compensate for the decreased efficiency, which then produces even more heat, encouraging the growth of even more defects and a greater loss of efficiency. If a diode could be maintained at or near its optimum temperature, then the diode will have its maximum efficiency and lifetime, and emit a consistent wavelength.

To reduce the temperature of the diode to an acceptable level while providing a high average output power, diodes are often operated in a pulsed mode wherein current is applied to the diode during only a portion of the operating time. In this mode, the heat has an opportunity to dissipate during the time when current is off. In the pulsed mode of operation, a figure that describes the percentage of time that the diode is pulsed is the "duty cycle". For example, a duty cycle of 1% corresponds to a diode that is actuated with current only once in 100 cycles. Typically, laser diodes will be operated at a duty cycle of 1% and a supplied current of fifty amps/cm of length. However, if some extra cooling is available, higher duty cycles can be attained. If much more substantial cooling were available, continuous (cw) operation may be obtainable for optimum current levels. The cooling problem is of particular significance for arrays of laser diodes.

Arrays of laser diodes include a number of laser diodes positioned closely together. Laser diode arrays may be manufactured in various architectures such as the stacked architecture and the monolithic surface emitting architecture. In one configuration (the "rack and stack" configuration) the laser diodes are positioned in a stacked configuration, one on top of the other. In another configuration, the monolithic surface emitting architecture, a number of edge emitting laser bars are positioned on the surface of a thermally conductive material, next to reflectors angled at 45°. Thus, the laser radiation from the laser diode bars is first emitted in a direction along the surface of the block, but is then reflected upward by angled reflectors on the block's surface.

A feature of the laser diode array is the high intensity output provided from the closely packed laser diodes. Another advantage of the diode array is that the output beam's area can be made larger simply by increasing the area of the array. To obtain the higher intensity, the laser diodes in the array should be positioned closer together. However, as a result of close positioning, the heat flux from each laser bar will add with the heat flux of the adjoining laser bar, and without aggressive cooling the temperature may increase rapidly. At a high output power (a high intensity and long duty cycle), the amount of heat flux produced in each diode becomes very substantial.

As a result, the average output intensity of a diode array is substantially limited by its ability to sink heat. Using only ambient air cooling, average power output must be limited by maintaining the current and duty cycle at a level sufficient to prevent damaging temperature buildup. There is a tradeoff between output power and output pulse duration; a long duty cycle must be balanced by a small current, and conversely, a large current must be balanced by a short duty cycle. The heat flux in a diode array is substantial during a period of high output. Without additional cooling, a laser diode array operated at a high average power will produce a large heat flux which can cause a rapid temperature increase, leading to device failure and other temperature associated problems discussed above. Therefore, a higher intensity output will generally require a more effective cooling system.

Two performance figures of merit for cooling purposes are thermal resistance and temperature uniformity. Thermal resistance is defined as the temperature rise at the laser junction relative to the coolant inlet temperature, per watt/cm$^2$ of heat load. The causes and effects of heat load are well known, and have been discussed above.

Temperature uniformity is a measure of the maximum temperature variation across the surface where the heat is applied. Lack of temperature uniformity could be caused by coolant heating or variations in heat load or thermal resistance. For applications such as high power laser diode arrays, a heat sink should have figures for thermal resistance and temperature uniformity small enough to dissipate the large amount of heat generated by high average power operation. In these high power applications, if a heat sink were available that had low figures for thermal resistance and temperature uniformity, the cost per watt of output laser power would be reduced significantly.

Another problem that arises in high average power laser diode arrays is thermal expansion mismatch. A material's thermal expansion coefficient describes the extent of the material's expansion caused by a temperature change. If two materials that have a thermal expansion mismatch are bonded together, then a temperature change may result in a cracking of the structure of one material or the other, or it may result in a compromise of the bond between the two materials. Gallium Arsenide (GaAs) is a conventional material for laser diodes; its thermal expansion coefficient is different than that of, for example silicon (Si), and many other materials.

Problems with low temperature uniformity, thermal resistance, and thermal expansion mismatch exit with regard to the stacked arrays. To address these problems, it has been suggested that thermally conductive material having a similar expansion coefficient be placed between the diode bars, in a "rack and stack" architecture. The thermally conductive material may be copper or a copper-tungsten alloy, such as Thermkon®, a General Electric product, that is matched to the thermal expansion constant of GaAs. This material may be made thick to absorb excess heat. However, the thermal conductance of copper or Thermkon® is insufficient for operation at a high duty cycle. Another product used in the rack and stack architecture is beryllium oxide (BeO), which has an even lower thermal conductance, and therefore allows an even smaller duty cycle. BeO is used because its thermal expansion matches the thermal expansion of GaAs, therefore it provides a structurally sound package even while operating at high temperatures. It has also been suggested that a diamond material be used in the rack and stack architecture. Diamond has a high thermal conductivity; however, manufacturing is difficult and costly due to the diamond's hardness.

Thermal expansion mismatch is not a problem when a single material is used. For example, if a cooler package could be formed of a single material, such as silicon, then the material would expand evenly and structural integrity would not be compromised. Thus, it would be an advantage to provide a cooler package constructed of a single material.

Furthermore, it would be an advantage if the cooler package is as thin as possible. In a cooler package any of a given length the cooler's thinness allows more packages to be started together. Each cooler has an associated laser diode, and thus more cooler packages in a given length translates to a greater intensity of output laser light.

Microchannel coolers (i.e., silicon wafers with microchannels etched therein) have been used to cool integrated circuits. However, methods of bonding silicon to silicon have been generally ineffective, thus requiring an intermediate layer of, for example silicon glass. If the array were to be designed in a manner suitable for bonding silicon to silicon, then such a laser diode array would have many uses including application as an efficient pump source for pulsed solid state lasers.

Problems in applying microchannel cooler technology to laser diodes include: providing robust and effective cooling in a small package. The cooling problem is complex, including problems with providing coolant to the microchannels at a high flow rate, and delivering coolant to the microchannels uniformly so that there are no substantial temperature gradients along the diode bar. Thus an effective coolant delivery system must be developed. Prior microchannel technology has been addressed to providing cooling to an area within a layer silicon wafer, thus the prior coolant delivery systems have not been designed to provide effective cooling proximate to an edge of the wafer. It would be an advantage if the coolant delivery system effectively cooled near an edge, so that the diode base can be mounted close to the edge. In an array mounting the diodes closely together and close to the edge provides a high output intensity. In addition, diodes mounted at the edge of the array may be more easily connected to fiber optic lenses.

A further problem with conventional laser diode arrays is the difficulty of repair or replacement of worn-out or malfunctioning equipment. Conventional laser diode arrays have been formed of a number of laser diodes structurally connected together in such a manner that replacing a laser diode that is non-functional or otherwise not working is difficult or impossible. This disadvantage is particularly acute in manufacturing laser diode arrays; testing each of the laser diodes before installation is difficult. If a non-functional laser diode was discovered after manufacture of such a structurally connected diode array, then the whole array would be scrapped or re-manufactured at a substantial cost. It would be an advantage to provide a package that has an edge emitting laser diode bar and a heat sink that can remove a significant amount of heat from the laser diode so that the laser diode can be operated at a high average power. It would be an advantage if the laser diode array could be formed of a number of similar laser diode and cooling packages that are interchangeable and easily replaceable, so that if a particular package becomes inoperable or of poor quality, then the package can be easily replaced at low cost without affecting the remainder of the diode array.

SUMMARY OF THE INVENTION

The present invention provides an apparatus for cooling laser diode arrays. The invention comprises a diode-cooler assembly that provides a large amount of cooling in a small area. The diode-cooler assemblies are thin, and they can be closely stacked, one on top of the other, to create a structure having a high average output intensity. The assemblies are easily replaceable and interchangeable to facilitate easy repair and replacement. Furthermore, the size of the stack can be easily changed by adding or removing diode-cooler assemblies to provide more or less output energy. Using the principles of the present invention, a laser diode array may be operated for extended periods of time at high intensity. The mode of laser operation may include a long duty cycle, or even continuous operation.

The present invention comprises a laser diode and cooling means that are connected in a compact, thin planar assembly having the laser diode located proximate to one edge. In an array, any number of such thin planar assemblies can be secured together, stacked one on top of the other. In this array, the assemblies are connectable in close proximity so that the laser diodes in each are very closely spaced and provide a high intensity output over an area as large as the number of assemblies. In a preferred embodiment, the planar assemblies are separated by a thin gasket made of conductive material, such as a silicone elastomer filled with silver-coated copper. The thin gasket provides a watertight seal between the assemblies, as well as a current path.

The coolant distribution system within the assemblies provides efficient, controlled, and uniform cooling. The assembly includes microchannels which run parallel to the laser diode bar and can be located very close to the edge of the assembly. The close proximity of the microchannel heat sink to the edge permits the laser diode bar to be located close to the edge. Mounting the diodes closely in the array provides a high output intensity.

Each planar assembly comprises three wafers. The wafers comprise a substrate having a system of microchannels, grooves and slots formed therein which provide coolant distribution within the assembly. The wafers have multiple pairs of holes defining inlet corridors and outlet corridors. The inlet and outlet corridors, which extend through the array, are connected to a conventional coolant circulation system.

In operation, coolant flows into and through the inlet corridors. The coolant is guided through grooves between the middle and bottom wafers, and then through slots in the middle wafer. The slots are positioned proximate and perpendicular to microchannels on the underside of the top layer. The microchannels, situated proximate to the laser diode, form a heat sink where coolant absorbs heat generated by laser operation. The heated coolant is removed from the microchannels by an adjacent slot. The slot connects to a groove between the middle and bottom wafers that in turn connects to an outlet corridor.

The inlet slots direct the coolant flow up and into the microchannels, thereby providing high cooling power and efficient heat transfer at the coolant-microchannel interface. Furthermore, cooling power is enhanced by a narrow cross section of the inlet slots with respect to the inlet passageways. The narrow cross section causes a Venturi effect to the coolant flow—the velocity of the coolant is increased as it flows from the wider inlet passageway into the inlet slot and then into the microchannels. Therefore the coolant is injected into the microchannels with greater velocity for more effective cooling.

The three wafers in the assembly—the top wafer, the middle wafer, and the bottom wafer—are preferably formed of a single material, such as silicon. Silicon is inexpensive and, using conventional technology, it can be cut into thin wafers, which can then be cut and etched to form slots, grooves, and microchannels. Using a method described herein, the silicon wafers can be bonded together to form a thin assembly. The thinness is an advantage because the laser diodes can be positioned in close proximity for high intensity, while maintaining a low temperature due to the cooling action of the microchannels. As an additional advantage, the adjacent wafers, which are formed of the same material, have the same thermal expansion coefficient, a feature that ensures structural integrity during thermal expansion.

The present invention has use as an optical pump for high power solid state lasers. Pumping a laser gain material with laser diodes provides a substantial advantage when compared with flashlamps, which are the conventional choice for pumping solid state lasers. If properly cooled, laser diodes have a very long life, and can be reliable in operation over long periods of time. As a further advantage, laser diodes can output single frequency radiation which can be matched to the peak absorption of the solid state laser gain material. Additionally, the laser diode's conversion of electrical energy to optical energy is very efficient; laser diodes require only modest electrical voltage and power. In comparison, flashlamps are less efficient and require electrical energy with high power and high voltage. Thus, the present invention provides the basis for efficient high power solid state lasers.

The present invention provides an efficient optical source having small size and low energy requirements. In addition to its uses as a laser pump, the present invention can be incorporated in equipment such as communications devices and active sensors. Thus, the present invention is useful in any application that has space constraints and energy limitations, including military and space applications.

DETAILED DESCRIPTION OF THE INVENTION

The invention is best understood by reference to the figures wherein like parts are designated with like numerals throughout. This section begins with a general description, followed by a more specific description in which the general description is expanded upon, and the preferred embodiment is described in more detail.

GENERAL DESCRIPTION

Figure 1:
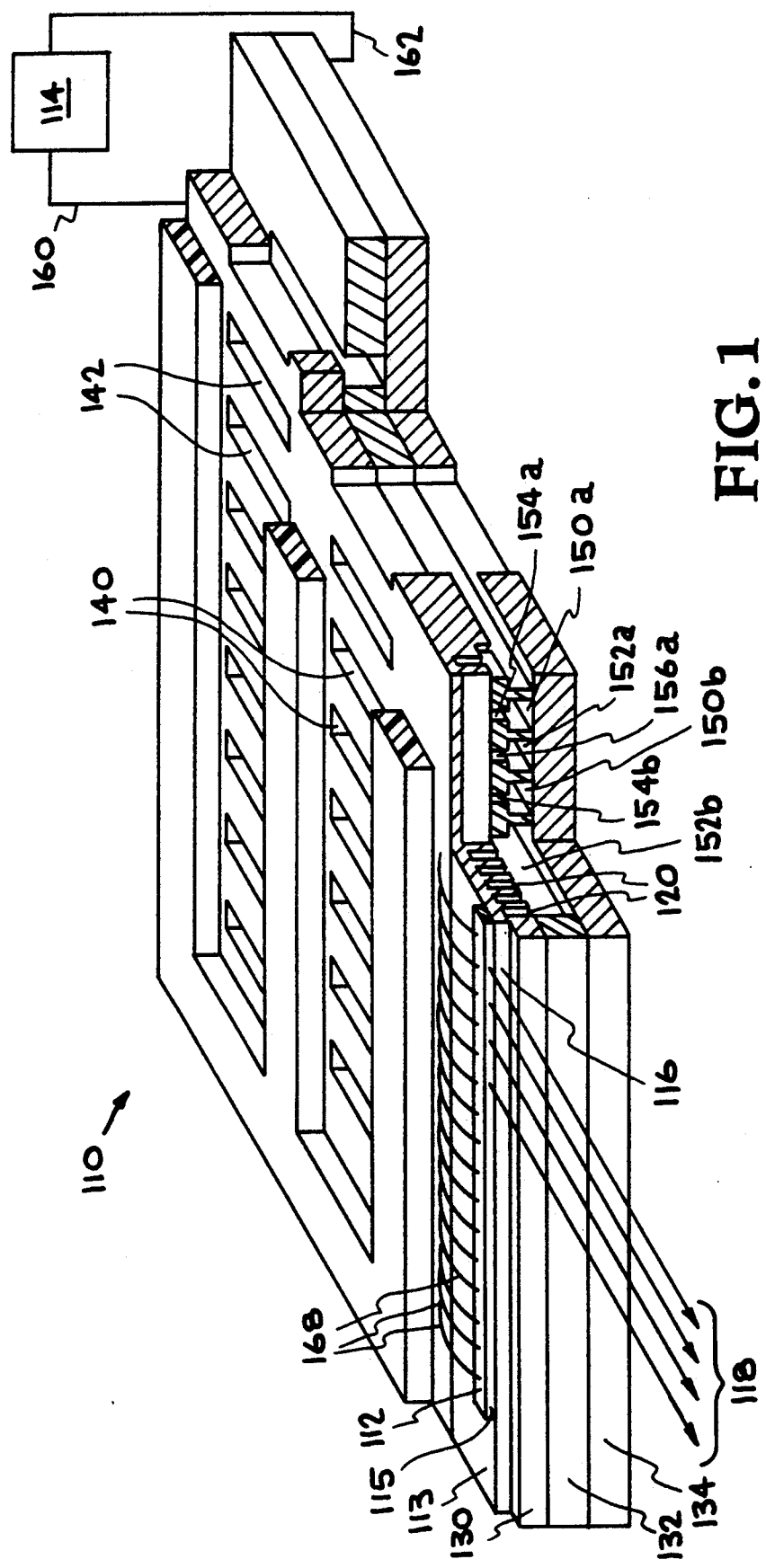
FIG. 1 is a perspective view of a thin planar assembly including a laser diode bar and cooling means, and showing a partial sectional view of the assembly.

FIG. 1 shows a compact, thin planar assembly 110 with a laser diode bar 112 mounted on a top surface 113. Electric current is provided to the laser diode bar 112 by a conventional electric current source 114. The laser diode bar 112 is positioned proximate to the edge 116 so that emitted laser light 118 is substantially unobstructed by the top surface 113. Preferably, the laser diode bar 112 is positioned so that its emitting edge 115 is aligned with the edge 116. The heat generated by the laser diode 112 flows to microchannels 120 formed proximate to the diode bar 112. Coolant is forced through the microchannels 120 to remove the heat. The coolant, such as water, is pumped through the assembly 110 by a conventional coolant circulation system 122 shown in block in FIG. 2.

Figure 2:
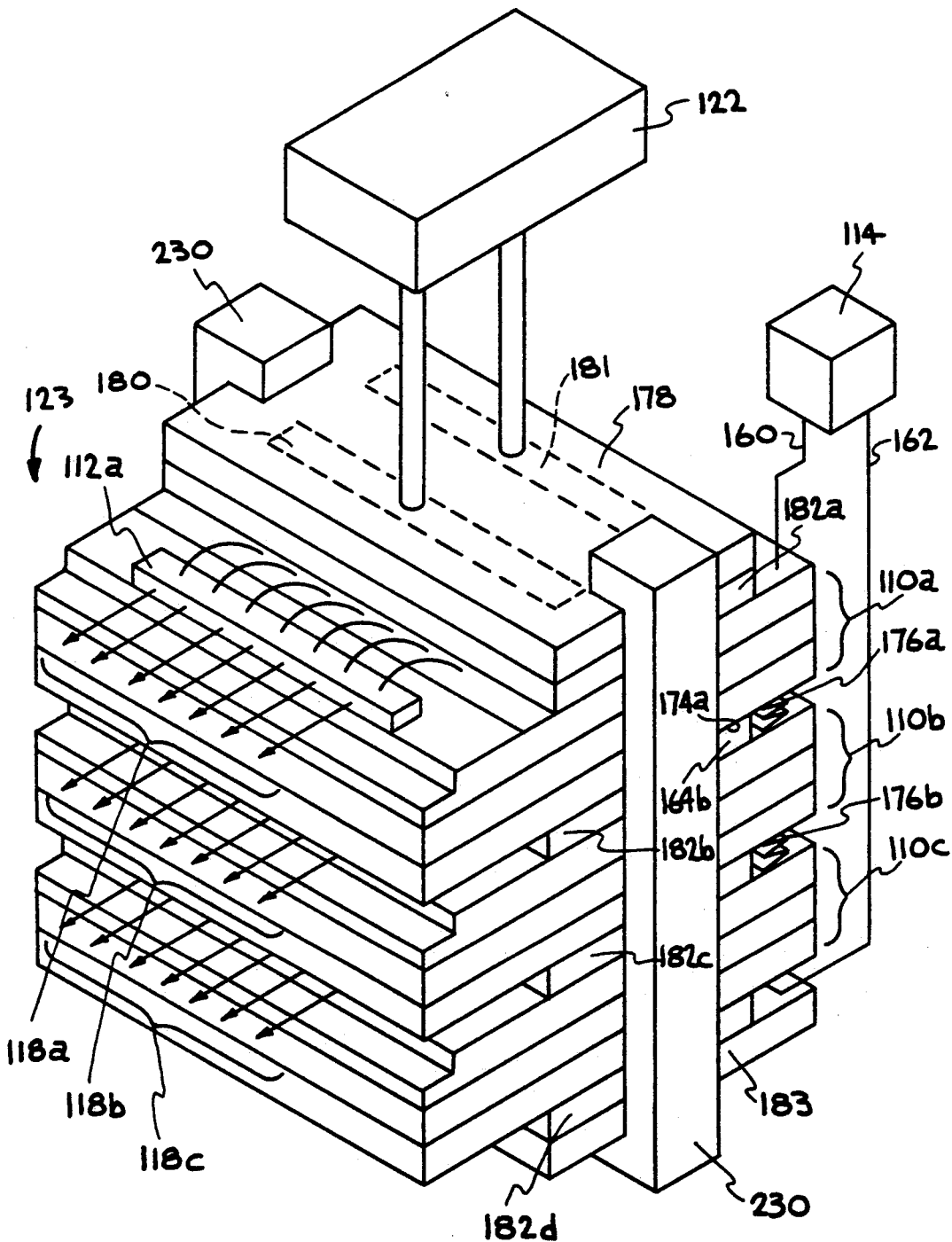
FIG. 2 is a perspective view of a diode array comprising a plurality of thin planar assemblies connected together.

A plurality of these assemblies 110 can be stacked to form an array 123, as illustrated in FIG. 2. The assemblies 110 may be secured together by a securing means such as a clamp 230. Three assemblies 110a,110b,110c, are illustrated in FIG. 2, but in other embodiments the array 123 may comprise any number of the asemblies 110. In the array 123, the assemblies 110 are connected in such close proximity that the laser diode bars 112 are very closely spaced and therefore provide a high intensity laser output 118a,118b,118c over an area defined by the array 123.

Figure 3:
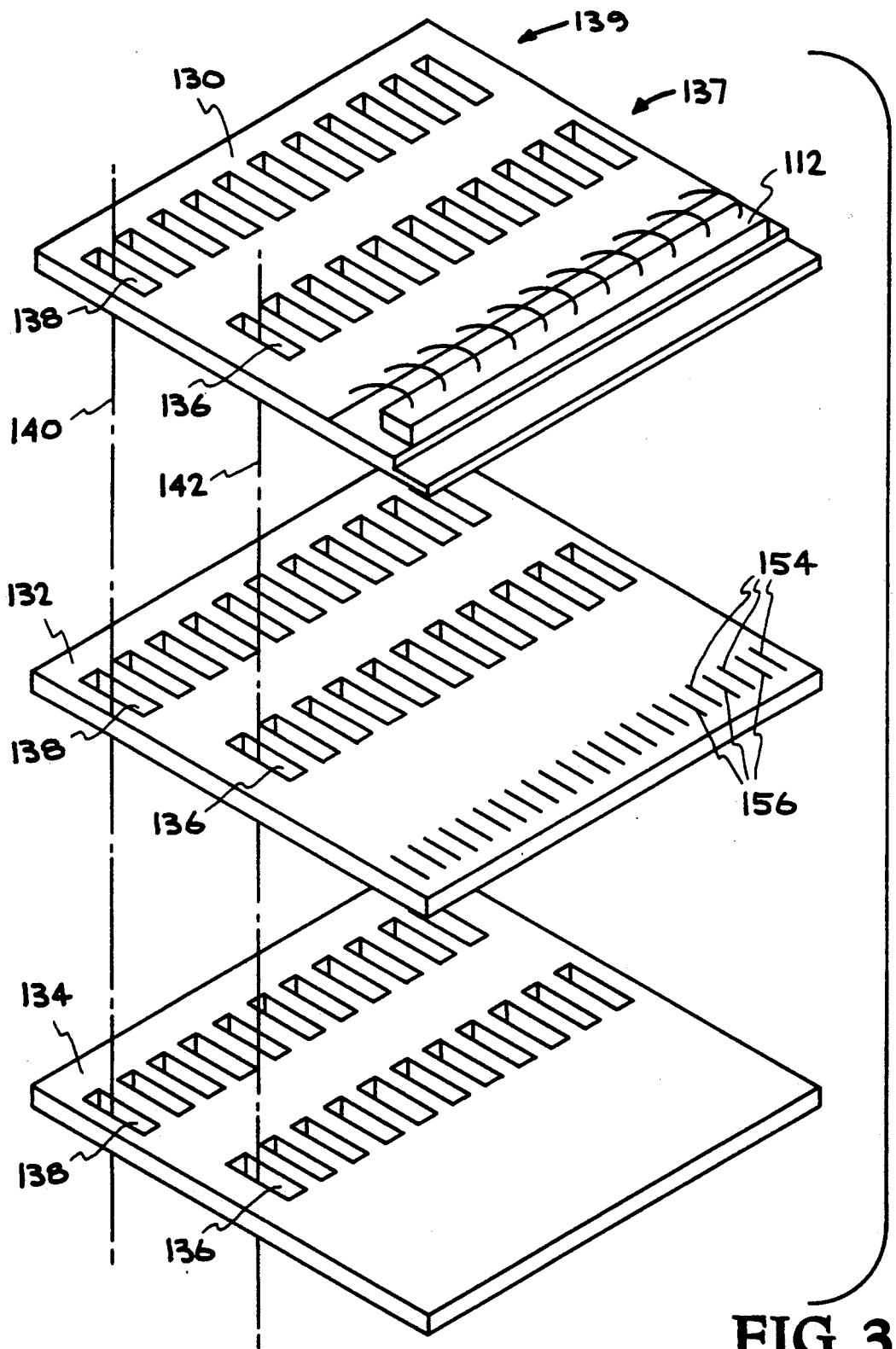
FIG. 3 is an exploded view of the thin planar assembly, illustrating its construction in three wafers: a top wafer on which the laser diode bar is mounted, a middle wafer, and a bottom wafer.

As illustrated in FIG. 3, each assembly 110 is constructed of three separate wafers 130,132,134 each of which preferably comprises a silicon substrate. Each of the wafers 130,132,134 has a plurality of inlet holes 136 extending therethrough that are formed in a row 137, and a plurality of outlet holes 138 that are formed in an outlet row 139. The rows 137,139 are formed parallel to the length of the laser diode bar 112. The holes 136 define inlet corridors 137, and the holes 138 define outlet corridors 142. The coolant circulation system 122 (FIG. 2) provides coolant flow through these corridors 140,142.

The underside of the top wafer 130 comprises the plurality of microchannels 120 formed substantially parallel to the laser diode bar 112. The microchannels are shown in FIGS. 1, 4, 5, 6, and 7. The microchannels 120 form a heat sink on the underside of the top wafer 130 proximate to the laser diode bar 112. The coolant flowing through the microchannels 120 absorbs heat produced by the laser diode bar 112.

Figure 4:
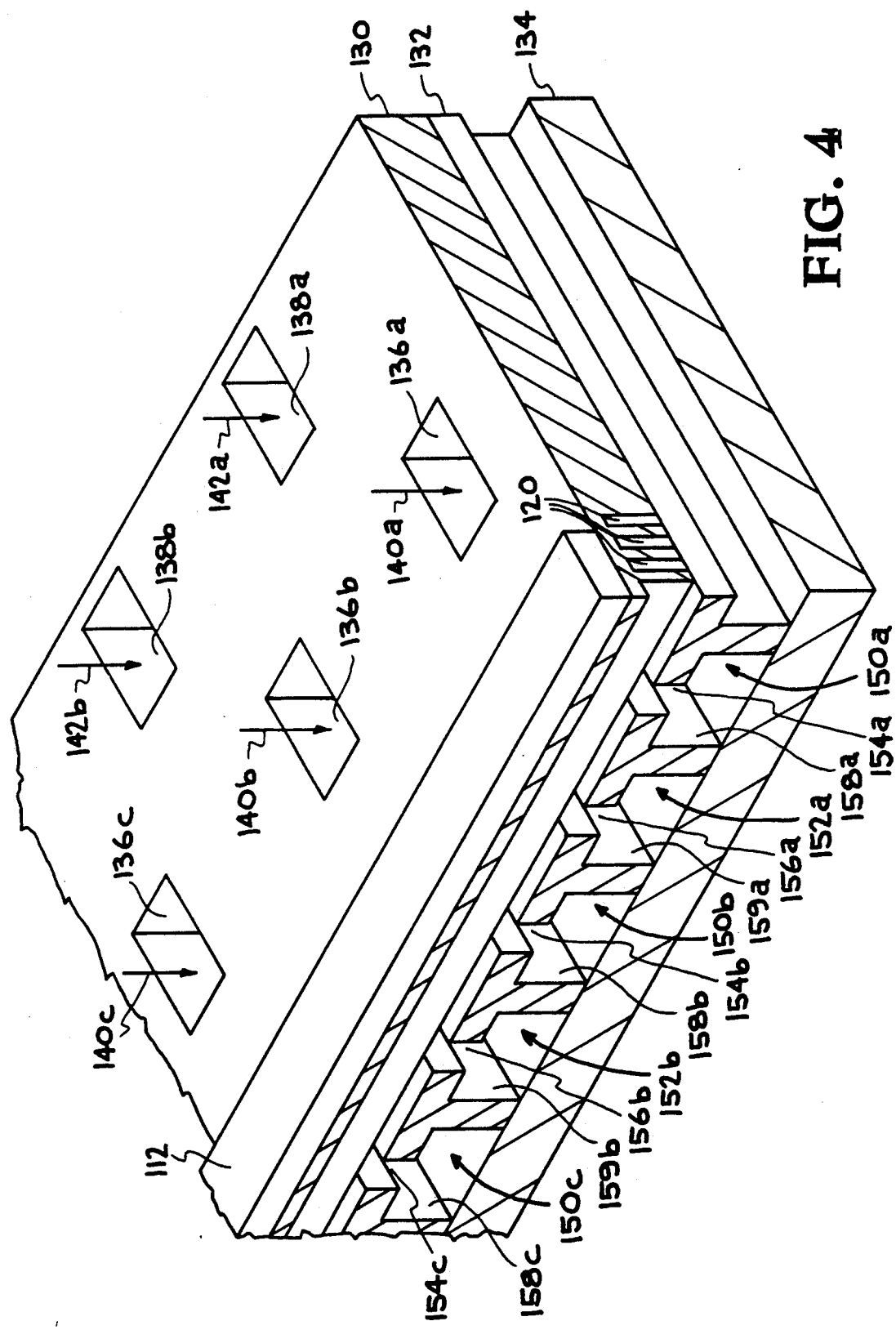
FIG. 4 is a sectional view of the thin planar assembly with a side and the front edge cut off.

As shown in FIGS. 1 and 4, the middle wafer 132 and the bottom wafer 134 comprise a plurality of inlet passageways 150, and outlet passageways 152. The inlet passageways 150 provide coolant flow between the inlet corridors 140 and the microchannels 120, and the outlet passageways 152 provide coolant flow between the outlet corridors 142 and the microchannels 120. In the preferred embodiment the passageways 150,152, comprise a plurality of slots 154,156, (shown in FIGS. 3 and 4) formed in the middle wafer 132. The slots 154,156 are formed to be substantially perpendicular to the microchannels 120 in the top wafer 130. The underside of the middle wafer 132 also comprises a plurality of grooves 158,159 which extend between the inlet and outlet corridors 140,142 and the respective slots 154,156. When the middle wafer 132 and bottom wafer 134 are bonded together, the passageways 150,152 are defined by the grooves 158,159, the adjacent portion of the bottom wafer 134, and the slots 154,156.

In an array 123 of assemblies 110, illustrated in FIG. 2, the thinness of the wafers 130,132,134 is an advantage because the laser diode bars 112 can be positioned in close proximity for high intensity output over a large area, while maintaining a low temperature due to the cooling action of the microchannel heat sinks 120. Although for illustration purposes the assemblies 110 appear in some figures to be rectangular boxes, in the preferred embodiment, the assemblies 110 are quite thin—the wafers 130,132,134 have a combined height of 1.3 mm, and with the laser diode 112, which has a height of 0.1 mm, the height of the assembly 110 is only 1.4 mm.

MORE SPECIFIC DESCRIPTION

As shown in FIG. 1, the present invention comprises the compact, thin planar assembly shown generally at 110, with the laser diode bar 112 mounted thereon. The laser diode bar 112 may comprise any of a number of commercially available semiconductor laser diode bars, available from a number of manufacturers such as Siemens AG of Munich, West Germany, and Applied Solar Energy Corp. of City of Industry, CA.

When a raw diode block is obtained from the manufacturer, the block typically comprises a thin, square piece of semiconductor material, such as Gallium Arsenide (GaAs) with the pn junction formed throughout the square in a plane parallel to the square's surface. Furthermore, the crystal axes in the semiconductor are formed so that they are perpendicular to an edge. Using this diode square, the individual diode bars are formed by first using a conventional scribe tool, which nicks the edge of the square semiconductor material at fixed intervals. Using the nicks as a guide, the square is separated by a conventional cleaving device into a number of bars by breaking the square along the crystalline axes. The bars are finally cleaned by conventional plasma ashing, which turns any trace of organic materials into an ash which can be easily removed. A smooth facet is formed by this process, which is then made reflective by conventional techniques. In the preferred embodiment, the output facet is coated with one-half wave thickness $Al_2O_3$, and the rear facet is coated with a quarter wave stack of eight layers of $TiO_2/SiO_2$.

Reference is again made to FIG. 1, in which the laser diode bar 112 is positioned proximate to the edge 116 so that the emitted laser light 118 is substantially unobstructed by the top surface 113. Preferably the emitting edge 115 of the diode bar 112 is positioned adjacent to the edge 116. The laser diode bar 112 is bonded to the top wafer 130 using conventional methods, such as a conventional indium solder. In the preferred bonding technique, the laser diode bar 112 is clamped to the top wafer 130 by a clamp (not shown) that has an elastomer edge that presses the length of the bar 112 into tight contact with the evaporated indium solder that was formed on the wafer 130. The bar 112 and the wafer 130 are then heated enough that the solder melts, and then the solder is cooled to form a solid mechanical and electrical bond. Although the diode bar 112 is illustrated in the Figures as a single long bar of semiconductor material, in practical application two or more separate shorter bars of semiconductor material, placed end to end, may be utilized instead of the single longer bar.

Figure 5:
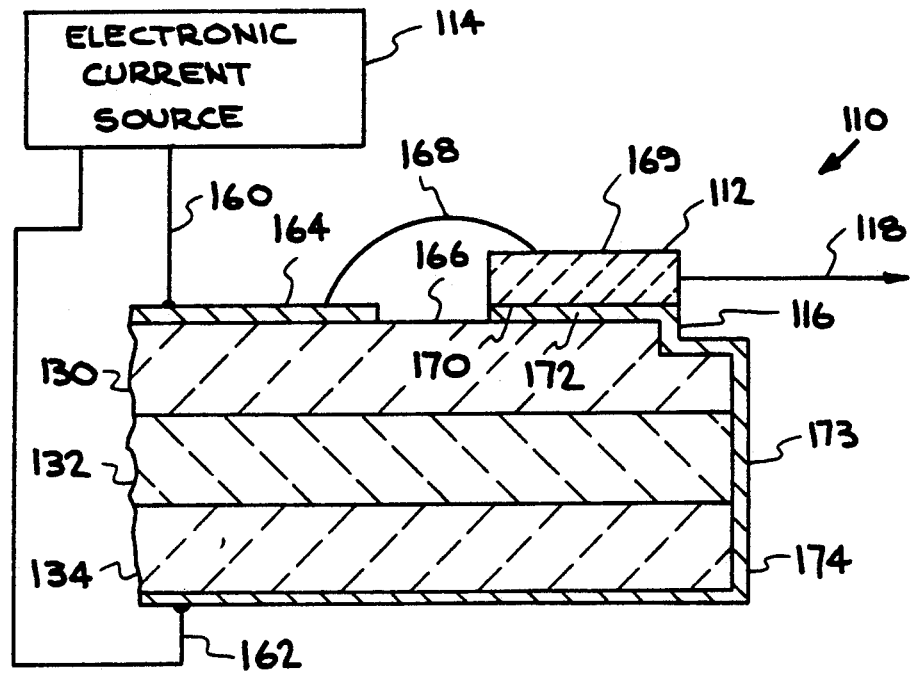
FIG. 5 is a cross section of the assembly, viewed from a side to illustrate the flow of coolant through the assembly.

With reference to FIGS. 1 and 5, the conventional electric current source 114 provides an electric current to the laser diode bar 112. In the assembly 110, the electric current is delivered through a first terminal 160 provided on the top of the wafer 130, and a second terminal 162 provided on the bottom of the bottom wafer 134. For purposes of illustration, the first terminal 160 will be assumed to be the positive terminal 160, and the second terminal 162 will be assumed to be the negative terminal 162, and electric current will be assumed to flow from positive to negative.

In operation, illustrated with reference to FIG. 5, the electric current flows into the positive terminal 160 and along the top surface of the top wafer 130, via a metallized portion 164. The metallized portion 164, and all other metallized portions preferably comprise a gold conductive layer. In the preferred embodiment, a thin (1000 Å) layer of titanium is formed directly on the wafer 130, and a thin (1000 Å) layer of platinum is formed on top of the titanium. The gold conductive layer is then formed on top of the platinum, in a thickness sufficient to carry the current, for example 1.5 microns. Where the laser diode bar 112 connects with the top wafer 130, another 1000 Å layer of titanium or platinum is formed on top of the gold conductive layer, a thin layer (1000 Å) of gold is formed on top of the titanium or platinum, and the indium solder is evaporated on top of the thin gold layer, to provide a connection between the top wafer 130 and the laser diode bar 112.

The top surface of the top wafer 130 has a nonconductive electrical break 166, which prevents flow of electrical current between the metallized portion 164 and a metallized portion 172 positioned under the laser diode. Over this electrical break 166, a series of wires 168, preferably gold wires, electrically connect the metallized portion 164 with an electrode 169 disposed on top of the laser diode bar 112.

In the laser diode bar 112, electrical current flows between the top electrode 169 and an electrode 170 on the bottom, providing current through a semiconductor junction to cause emission of the laser radiation 118. Assuming the direction of current flow is consistent with the discussion in the previous paragraphs, the top electrode 169 is the anode, and the bottom electrode 170 is the cathode of the laser diode bar 112. The electrode 170 on the bottom of the laser diode bar 112 is electrically connected to the metallized portion 172 in the top wafer 130. Thus, current flows from the bottom electrode 170 to the metallized surface 172, which continues around the corner of the top wafer 130, and contacts a metallized portion 173 of the middle layer 132, which in turn contacts a metallized portion 174 of the bottom layer 134, which is connected to the negative terminal 162 (FIG. 1). Thus, a current path is provided from the laser diode bar 112, along the front edge 116 of the assembly 110, the current path including the metallized portion 172 of the top wafer 130, the metallized front edge 173 of the middle wafer 132, and the metallized portion 174 of the bottom wafer 134.

To select a desired intensity of the laser output, the electrical current source 114 is operated to provide a level of electrical current that provides the desired output intensity to each diode in the array 123. As illustrated in FIG. 2, wherein a plurality of planar assemblies 110 are stacked together, at least one metal clip 176 may be disposed between each adjacent assembly 110 to provide a current path between adjacent diode assemblies 110. For example, the metal clip 176a, disposed between the assembly 110a and the adjacent assembly 110b, electrically connects the metallized bottom surface 174a of the planar assembly 110a with the metallized top portion 164b of the planar assembly 110b below it. When a plurality of such clips 176 are connected between each of the planar assemblies 110, then the laser diode bars 112 are electrically connected in series. In another preferred embodiment, the clips 176 are not necessary, if the gaskets between the diode assemblies 110 are formed of a conductive elastomer that provides a current path as well as a watertight seal.

A suitable coolant, such as water, is distributed through the assembly 110 by the conventional coolant circulation system 122. The planar assemblies 110 of the preferred embodiment have been operated with a coolant circulation system 122 that comprises a Neslab chiller with 55 psi to provide pressure for coolant circulation. However, the planar assemblies 110 have been tested to withstand a higher pressure, and therefore the coolant circulation system 122 may be used with a higher pressure than 55 psi for even greater cooling ability.

In FIG. 2, the coolant circulation system 122 is connected to a header 178. An inlet manifold 180 and an outlet manifold 181 are formed in the header 178, which provide a coolant between the coolant circulation system 122 and the corridors 140,142 (FIG. 1). In order to form a watertight seal, a thin gasket 182a is disposed between the header 178 and the topmost package 110a. Preferably, the header 178 and the gasket 182a both comprise a conductive material for electrical current flow, and thus, the terminal 160 may be connected directly to the header 178, obviating the need for the clips 176. For example, the header 178 may comprise stainless steel or copper, and the gasket 182a may comprise silicone elastomer filled with conductive material such as silver-plated copper particles. Silicone elastomers are available from the Seal Group of the Parker Hannifin Corporation of Lexington, Ky., or SAS Industries of Manorville, N.Y. The gasket 182a may be molded or cut from a sheet. In other embodiments, if the gasket 182a is not required to be conductive, it may comprise a Teflon ® material such as Gore-tex ®. At the bottom of the array 123, a plate 183 is disposed to seal the coolant flow within the corridors 140,142. A gasket 182d is positioned between the plate 183 and the adjacent diode assembly 110c, and preferably the gasket 182d comprises a conductive material such as a silicone elastomer filled with silver-plated copper particles. The plate 183 may comprise a conductive material such as stainless steel or copper, and the terminal 162 may be connected directly thereto.

The gaskets 182b,182c are disposed between each of the assemblies 110 in order to provide a watertight seal. Preferably, each gasket 182b,182c comprises conductive material such as a silicone elastomer filled with silver-plated copper particles, thus providing a current path between each diode assembly 110. If the gaskets 182b,182c are not required to be conductive, they may comprise a Teflon ® material such as Gore-tex ®. The gaskets 182b,182c are preferably thin (for example 0.010 inch) so that the assemblies 110 are positioned in close proximity to each other. As a result, the laser diode bars 112 are very closely spaced, and the array 123 can provide a high intensity laser output.

Reference is made to FIGS. 2 and 3, wherein the wafers 130,132,134 comprise holes 136,138 that define inlet corridors 140 and outlet corridors 142 when the assemblies 110 are aligned in an array 123. In the array 123 illustrated in FIG. 2, the means for securing the plurality of assemblies 110 is a clamp 230. Any conventional clamp will be adequate, preferably the clamp 230 compresses the gaskets 182 evenly. Preferably, the clamp 230 is non-conductive in order to prevent electrical current flow between the header 178 on the top of the array 123 and the plate 183 on the bottom of the array 123. In other embodiments (not shown), the array 123 may have a different securing means, such as a bolt, or bolts, extending therethrough.

As illustrated in FIG. 3, each assembly 110 is constructed of three separate wafers 130,132,134. When bonded together, the wafers 130,132,134 form the assembly 110 with cooling passageways integral therein. Each of the three wafers 130,132,134 preferably comprise a silicon substrate.

Each of the wafers 130,132,134 are thin, which allow the laser diode bars 112 to be positioned in close proximity for high intensity output over a large area. The silicon wafers 130,132,134 are bonded together, preferably by a direct thermal bonding process without electrostatic assistance. Silicon direct bonding is a process in which two separate wafers are brought into contact at room temperature and annealed in a furnace (1200° C.) to form a single piece. In the first step, each wafer 130,132,134 is wet-chemically micromachined with a $Si_3N_4$ mask to have the appropriate slots, manifolds, and microchannels, and the $Si_3N_4$ is removed. A modified RCA clear, omitting the buffered HF dip, is performed. Immediately after a fifteen minute deionized water rinse, the wafers 130,132,134 are put in a spin rinser/dryer. The resistivity set point of the effluent water from the spin rinser/dryer is greater than 14M$\Omega$-cm to assure maximum water surface reflectivity. The wafers 130,132,134 are then immediately aligned and bonded while the surfaces remain reactive. The surfaces to be bonded should be highly flat; flatness is important surfaces are in closer proximity when the two wafers are brought together. The surfaces do not have to be absolutely flat; however, a flatter surface preparation leads to a stronger attractive force between the two wafers. First, contact of the two surfaces should be made in a particle-free environment; particles in the micrometer range can produce voids with average diameters in the millimeter range. The wafers 130,132,134 should be bonded in a class 100 clean room. Vacuum tweezers should be used to handle the wafers 130,132,134. A conventional alignment jig is used to provide rough alignment of the wafers to be bonded. The alignment jig is made from Teflon ® and contains vacuum holes positioned adjacent to a corresponding hole in the wafer. After cleaning, a pair of wafers is placed on the vacuum fixture; preferably both wafers have alignment flats etched onto their perimeters to obtain precise x-y and rotational alignment. After the wafers are in position they are moved into contact. Then, vacuum is applied to bring the wafers even close together. It may be noted that the room temperature weak-bonding phenomenon will occur without vacuum assistance; however, use of the vacuum increases the process'yield. The vacuum is held on the fixture for approximately five minutes. Once the wafers are brought together, IR transmission imaging may be used to monitor bond quality.

After the initial weak bonding step, annealing is performed at a temperature of 1200° C. for forty minutes in a dry $N_2$ ambient. The bound wafers are placed in a quartz holder designed to hold three inch wafers in a horizontal position in the furnace. After annealing, the wafer bond may be viewed with a C-scan acoustic micrograph.

As illustrated in FIG. 3, each of the three wafers 130,132,134 comprise a plurality of pairs of the rectangular holes 136,138. The holes 136,138 are positioned in two rows, the inlet row 137 and the outlet row 139. The holes 136,138 are aligned with one another so that in the array 123 (FIG. 2), the holes 136,138 define the plurality of inlet corridors 140 and outlet corridors 142. The holes 136 in the inlet row 140 define the inlet corridors 140 for coolant entry into each assembly 110. The holes 138 in the outlet row 139 define the outlet corridors 142.

Reference is made to FIG. 1 and FIG. 4, which is a close-up of a portion of the assembly 110 shown in FIG. 1. The bottom surface of the top wafer 130 comprises a plurality of microchannels 120 proximate to the laser diode bar 112. In the preferred embodiment, the microchannels 120 are formed in the wafer 130, parallel to the lengthwise direction of the laser diode bar 112. The microchannels 120 can be formed by conventional anisotropic etching techniques which etch the material along crystal axes.

The top surface of the middle wafer 132 comprises a plurality of slots 154 formed perpendicular to the microchannels 120 in the top wafer 130. The slots 154 are formed in the middle wafer 132 using conventional etching techniques.

The bottom surface of the middle wafer 132 comprises a plurality of grooves 158,159 which, when enclosed by the top surface of the wafer 134, form the passageways 150,152 connecting the respective corridors 140,142 with the respective slots 154,156. Particularly, one set of grooves 158 extends from the inlet holes 136 to the corresponding slots 154, and a second set of grooves 159 extends from the outlet holes 138 to the corresponding slots 156. The grooves 158,159 are preferably rectangular, and each has a width that is wider than its corresponding slot 154,156.

Coolant flow during operation is illustrated with reference to FIGS. 2, 4, 6, and 7. The coolant circulation system 122 (FIG. 2) supplies coolant to the inlet manifold 180, which is connected to all the inlet corridors 140 (FIG. 7). The coolant in each inlet corridor 140 flows under pressure through the inlet passageway 150, then through its corresponding inlet slot 154. For example, the pressurized coolant in the inlet corridor 140a is forced into the inlet passageway 150a. At the other end of the passageway 150a, the slot 154a (See FIGS. 6 and 7) directs coolant up and into the microchannels 120 in the underside of the top wafer 130; specifically, the inlet slots 154 direct coolant deep into the microchannels 120 for high cooling power and efficient use of the microchannels 120. Furthermore, cooling power is enhanced by the narrow cross-section of the inlet slots 154 with respect to the inlet passageways 150. The narrow cross-section causes a Venturi effect—the velocity of the coolant is increased as it flows from the wider passageway 150 into the inlet slot 154 and then into the microchannels 120. Therefore the coolant is injected from the inlet slots 154 up and into the microchannels 120 with greater velocity for more effective cooling.

The coolant absorbs heat from the microchannels 120 as it flows therethrough. The heated coolant then flows into the adjacent slot 156a due to a pressure differential between the inlet and outlet slots 154a,156a. The coolant flows through the slot 156a, and into the outlet passageway 152a. At the other end of the outlet passageway 152a, the outlet corridor 142a receives the heated coolant, which exits through the outlet manifold 181 (FIG. 2).

It should be apparent that in an array 123, the inlet corridors 140 and the outlet corridors 142 are common to all the planar assemblies 110 in the array 123, and thus only a single coolant circulation system 122 is required for the entire array 123.

Figure 6:
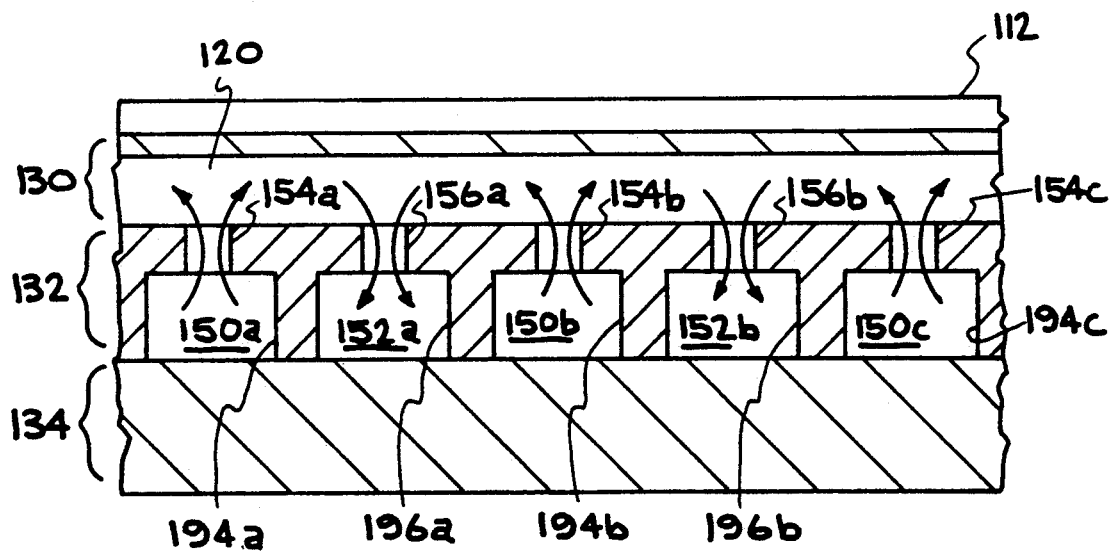
FIG. 6 is a cross section of the assembly, from the front, illustrating the flow of coolant through the assembly.
Figure 7:
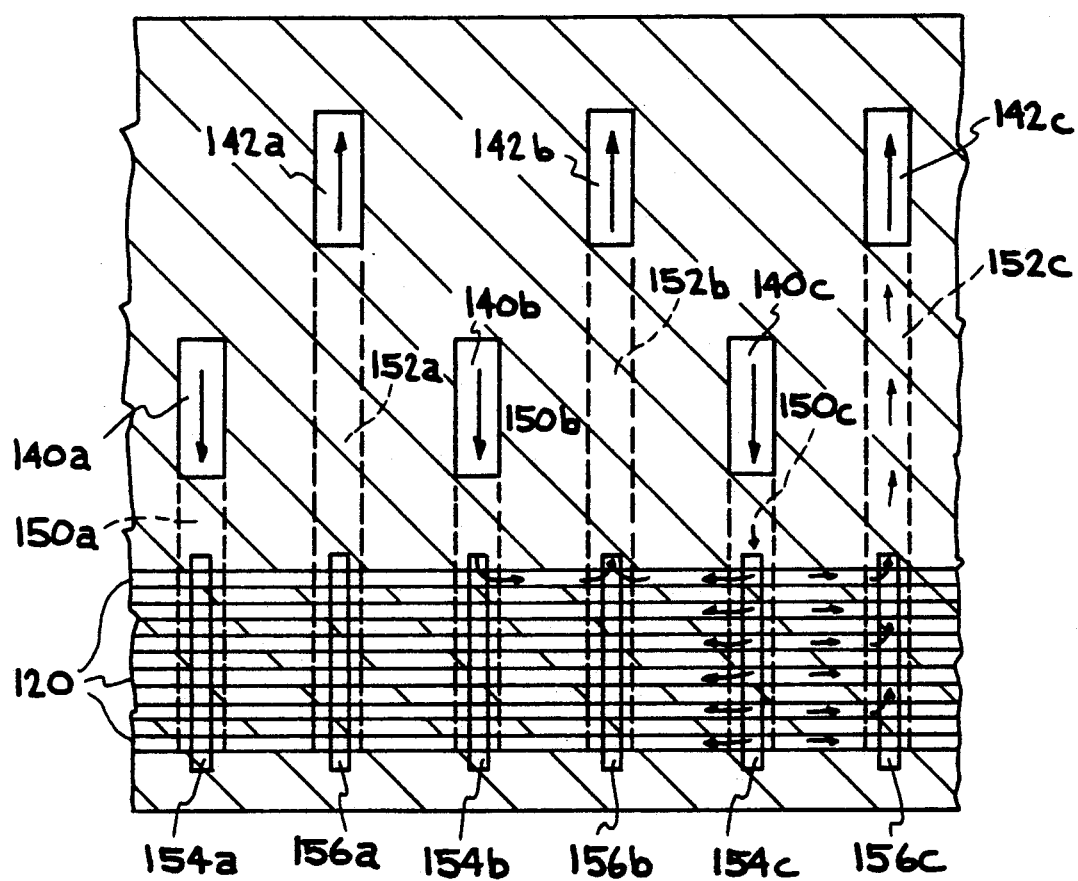
FIG. 7 is a diagram that illustrates the flow through the assembly, from the top perspective.

In summary, as illustrated in FIGS. 2, 6, and 7, a coolant path is provided from the inlet manifold 180 to the inlet corridor 140, through an inlet passageway 150 and the corresponding slot 154, which delivers coolant up into the microchannel heat sink 120 where heat from the laser diode bar 112 is absorbed. Then the coolant is routed through an adjacent slot 156 to the outlet passageway 152 which directs the heated coolant to the outlet corridor 142. The coolant may flow out of the outlet manifold 181 to the coolant circulation system 122. Although the corridors 140,142 have been respectively referred to as "inlet", and "outlet" corridors, coolant could be made to flow through the assembly 110 in either direction. The present invention provides adequate cooling regardless of the direction of coolant flow.

Although for illustration purposes the assemblies 110 appear to be rectangular boxes, in the preferred embodiment, the assemblies 110 are much thinner, and therefore can be placed closely together. As a result, the present invention provides a high intensity output that can be maintained continuously, or at a high average power.

For example, the wafers 130,132,134 have been fabricated to have a thickness of 0.017 inch (0.43 mm) each. When connected together, the three wafers 130,132,134 have a combined thickness of 0.051 inch (1.30 mm). A laser diode 112 may have a thickness of 0.004 inch (0.1 mm), and the gasket 182 may have a thickness of 0.010 inch (0.25 mm). The total thickness of the wafers 130,132,134, the diode 112, and the gasket 182 is 0.065 inch (1.65 mm). This figure is a measure of the separation between adjacent laser diodes 112 in the array 123. These figures are for illustration purposes only, and in other embodiments, the actual thicknesses may be less, or more.

The present invention provides sufficient cooling to operate the laser diode 112 in the pulsed mode or continuously at a very high average power output. The present invention has application as a pump for a high power solid state lasers. Incorporating the present invention in a conventional manner, high power lasers may be produced that are efficient and inexpensive, and have a small size compared with lasers that are available now.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing descriptions. All changes which come within the meaning and range of equivalency of the claims are to be embraced within their scope.

We claim:

1. An apparatus for actively cooling a diode with a coolant pumped by a circulation system, said apparatus comprising:
   a planar assembly thermally and electrically connected to the diode, said planar assembly comprising;
      a plurality of microchannels actively cooled by the coolant, said microchannels being thermally connected to the diode so that heat is conducted between the diode and the microchannels,
      a plurality of inlet corridors for providing coolant to the assembly,
      a plurality of outlet corridors for removing coolant from the assembly,
      a plurality of inlet passageways integral to the assembly, each of said inlet passageways positioned to provide coolant flow between one of the inlet corridors and one or more microchannels, and
      a plurality of outlet passageways integral to the assembly, each of said outlet passageways positioned to provide coolant flow between one of the outlet corridors and one or more microchannels.

2. The apparatus as claimed in claim 1, wherein the diode comprises an edge-emitting laser diode bar connected to the assembly, said edge-emitting laser diode bar being positioned proximate to an edge of the assembly.

3. The apparatus as claimed in claim 1, wherein the planar assembly further comprises:
   a top wafer, said wafer being mechanically connected to the diode, said wafer comprising the microchannels;
   a bottom wafer; and
   a middle wafer, said middle wafer being bonded between the top wafer and the bottom wafer, said middle wafer and an adjoining portion of the bottom wafer defining the inlet and outlet passageways which provide coolant flow between the microchannels and the inlet and outlet corridors.

4. The apparatus as claimed in claim 3, wherein the top, middle and bottom layers comprise a substrate of silicon material.

5. The apparatus as claimed in claim 3, wherein the diode comprises an edge-emitting laser diode bar connected to the assembly, said edge-emitting laser diode bar being positioned proximate to an edge of the assembly.

6. The apparatus as claimed in claim 5, wherein the top wafer comprises microchannels having a long axis, said microchannels being formed so that the long axis of the microchannels is parallel to the edge of the assembly that is proximate to the emitting end of the diode bar.

7. The apparatus as claimed in claim 6, wherein each inlet passageway is positioned to deliver coolant to an exclusive portion of the microchannels, and at least one outlet passageway is positioned adjacent to said inlet passageway so that it can remove coolant from said exclusive portion.

8. The apparatus as claimed in claim 7, wherein each inlet passageway comprises an inlet groove and an inlet slot, said inlet groove being formed in the bottom surface of the middle wafer, said inlet groove being enclosed by an adjacent portion of the bottom wafer to define an inlet passageway, said inlet passageway being positioned to communicate coolant from said inlet corridor to the inlet slot, said inlet slot being substantially perpendicular to the long axis of the microchannels, said inlet slot having a cross section for coolant flow that is smaller than that flow cross section of the inlet groove so that coolant flowing through the inlet slot is increased in velocity and therefore the coolant is injected into the microchannels with increased velocity; and further, wherein each outlet passageway comprises an outlet groove and an outlet slot, said outlet groove being formed in the bottom surface of the middle wafer, said outlet groove being enclosed by an adjacent portion of the bottom wafer to define an outlet passageway, said outlet passageway being positioned to communicate coolant from said outlet corridor to the outlet slot, said outlet slot being formed in the middle wafer, said slot being formed in a position to communicate coolant between the outlet passageway and the microchannels, said outlet slot being substantially perpendicular to the long axis of the microchannels.

9. A planar assembly for actively cooling a diode with a coolant pumped by a circulation system, said planar assembly being thermally and electrically connected to the diode, said planar assembly comprising:
   a plurality of microchannels actively cooled by the coolant, said microchannels being thermally connected to the diode so that heat is conducted between the diode and the microchannels;
   a plurality of inlet corridors for providing coolant to the assembly;
   a plurality of outlet corridors for removing coolant from the assembly;
   a plurality of inlet passageways integral to the assembly, each of said inlet passageways positioned to provide coolant flow between one of the inlet corridors and one or more microchannels, each of said passageways including an inlet slot positioned for injecting the coolant into the microchannels, said coolant slot having a narrow cross-section relative to the inlet passageway so that coolant flow is increased in velocity as it flows from the inlet passageway through the narrow cross section, thereby injecting the coolant into the microchannels with increased velocity; and,
   a plurality of outlet passageways integral to the assembly, each of said outlet passageways positioned to provide coolant flow between one of the outlet corridors and one or more microchannels.

10. The apparatus as claimed in claim 9, wherein each inlet slot is positioned to deliver coolant to an exclusive portion of the microchannels, and at least one outlet passageway is positioned adjacent to said inlet slot so that it can remove coolant from said exclusive portion.

11. The apparatus as claimed in claim 9, wherein the planar assembly further comprises:
   a top wafer, said wafer being mechanically connected to the diode, said wafer comprising the microchannels;
   a bottom wafer; and,
   a middle wafer, said middle wafer being bonded between the top wafer and the bottom wafer, said middle wafer and an adjoining portion of the bottom wafer defining the inlet and outlet passageways which provide coolant flow between the microchannels and the inlet and outlet corridors.

12. An array of laser diodes, comprising:
   a plurality of planar assemblies actively cooled with a coolant circulation system, said assemblies being stacked to form the array, each of said assemblies further comprising;
      a diode mounted on said planar assembly, said diode being thermally and electrically connected to the assembly,
      a plurality of microchannels actively cooled by the coolant, said microchannels being thermally connected to the diode so that heat is conducted between the diode and the microchannels,
      a plurality of inlet corridors to provide coolant flow between the assembly and the coolant circulation system,
      a plurality of outlet corridors to remove coolant flow from the assembly to the coolant circulation system,
      a plurality of inlet passageways integral to the assembly, each of said inlet passageways positioned to provide coolant flow between one of the inlet corridors and one or more microchannels, and
      a plurality of outlet passageways integral to the assembly, each of said outlet passageways positioned to provide coolant flow between one of the outlet corridors and one or more microchannels.

13. The apparatus as claimed in claim 12, wherein the diode comprises an edge-emitting laser diode bar connected to the assembly, said edge-emitting laser diode bar being positioned proximate to an edge of the assembly.

14. A laser diode array as claimed in claim 12, further comprising a plurality of conductive gaskets, each of which is positioned between adjacent planar assemblies.

15. A laser diode array as claimed in claim 12, wherein the assemblies are aligned so that the plurality of inlet corridors of each assembly are aligned with each other for coolant flow therethrough and the plurality of outlet corridors of each assembly are aligned with each other for coolant flow therethrough, and further comprising:
an inlet manifold that connects the plurality of inlet corridors to the coolant circulation system; and
an outlet manifold that connects the plurality of outlet corridors to the coolant circulation system.

16. The array of laser diodes as claimed in claim 12, wherein each assembly further comprises means for conducting electrical current through the respective laser diode.

17. A laser diode array as claimed in claim 16, wherein each of the planar package comprises a first electrical conductor on its top surface, said first conductor being electrically connected with a first electrode of the laser diode having a first polarity, and each of the packages further comprise a second electrical conductor on the bottom surface, said second conductor being electrically connected with a second electrode of the laser diode having a second polarity opposite to the first.

18. A laser diode array as claimed in claim 17, wherein each planar package comprises a first metallized surface for conducting current to the laser diode, and a second metallized surface for conducting current from the laser diode, and wherein the diode array further comprises a plurality of conductors, each conductor being positioned between adjacent packages so that adjacent packages are electrically coupled, said electrical connection being between the second metallized surface of each package and the first metallized surface of the adjacent package.

19. The array as claimed in claim 12, wherein each planar assembly further comprises:
a top wafer, said wafer being mechanically connected to the diode and comprising the microchannels;
a bottom wafer; and
a middle wafer, said middle wafer being bonded between the top wafer and the bottom wafer, said middle wafer together with the bottom wafer defining the inlet and outlet passageways which provide coolant flow between the microchannels and the inlet and outlet corridors.

20. The laser diode array as claimed in claim 19, wherein the top, middle, and bottom wafers comprise a substrate of silicon material.

21. The apparatus as claimed in claim 19, wherein the diode comprises an edge-emitting laser diode bar connected to the assembly, said edge-emitting laser diode bar being positioned proximate to an edge of the assembly.

22. The array of laser diodes as claimed in claim 21, wherein the top wafer comprises microchannels having a long axis, said microchannels being formed so that the long axis of the microchannels is parallel to the edge of the assembly that is proximate to the emitting end of the diode bar.

23. The apparatus as claimed in claim 22, wherein each inlet passageway is positioned to deliver coolant to an exclusive portion of the microchannels, and at least one outlet passageway is positioned adjacent to said inlet passageway so that it can remove coolant from said exclusive portion.

24. The apparatus as claimed in claim 23, wherein each inlet passageway comprises an inlet groove and an inlet slot, said inlet groove being formed in the bottom surface of the middle wafer, said inlet groove being enclosed by an adjacent portion of the bottom wafer to define the inlet passageway, said inlet passageway being positioned to communicate coolant from said inlet corridor to the inlet slot, said inlet slot being formed in the middle wafer, said slot being formed in a position to communicate coolant between the inlet passageway and the microchannels, said inlet slot being substantially perpendicular to the long axis of the microchannels, said inlet slot having a flow cross section smaller than that the flow cross section of the inlet groove so that the coolant flowing through the inlet slot is increased in velocity and therefore the coolant is injected into the microchannels with increased velocity.

* * * * *